United States Patent
Gabara (10) Patent No.: US 7,400,047 B2
(45) Date of Patent: Jul. 15, 2008

(54) INTEGRATED CIRCUIT WITH STACKED-DIE CONFIGURATION UTILIZING SUBSTRATE CONDUCTION

(75) Inventor: Thaddeus John Gabara, Murray Hill, NJ (US)

(73) Assignee: Agere Systems Inc., Allentown, PA (US)

( * ) Notice: Subject to any disclaimer, the term of this patent is extended or adjusted under 35 U.S.C. 154(b) by 231 days.

(21) Appl. No.: 11/010,721

(22) Filed: Dec. 13, 2004

(65) Prior Publication Data

US 2006/0125069 A1 Jun. 15, 2006

(51) Int. Cl.
H01L 23/52 (2006.01)
H01L 23/48 (2006.01)
H01L 29/40 (2006.01)

(52) U.S. Cl. .............. 257/777; 257/E27.161; 257/685; 257/686; 257/723; 438/108; 438/109; 361/760

(58) Field of Classification Search .......... 257/E27.137, 257/E27.144, E27.161, 686, 777, 685, 723, 257/724; 438/108, 109; 361/760
See application file for complete search history.

(56) References Cited

U.S. PATENT DOCUMENTS

| 4,947,228 | A | | 8/1990 | Gabara | 257/369 |
|---|---|---|---|---|---|
| 4,947,234 | A | * | 8/1990 | Einzinger et al. | 257/500 |
| 5,532,512 | A | * | 7/1996 | Fillion et al. | 257/686 |
| 5,731,709 | A | * | 3/1998 | Pastore et al. | 324/760 |
| 5,973,396 | A | * | 10/1999 | Farnworth | 257/698 |
| 6,031,279 | A | * | 2/2000 | Lenz | 257/686 |
| 6,184,585 | B1 | * | 2/2001 | Martinez et al. | 257/777 |
| 6,239,495 | B1 | * | 5/2001 | Sakui et al. | 257/777 |
| 6,395,630 | B2 | * | 5/2002 | Ahn et al. | 438/667 |
| 6,538,333 | B2 | * | 3/2003 | Kong | 257/777 |
| 6,586,266 | B1 | * | 7/2003 | Lin | 438/15 |
| 6,594,153 | B1 | * | 7/2003 | Zu et al. | 361/792 |
| 6,624,506 | B2 | * | 9/2003 | Sasaki et al. | 257/686 |
| 6,635,970 | B2 | * | 10/2003 | Lasky et al. | 257/777 |
| 6,774,466 | B1 | * | 8/2004 | Kajiwara et al. | 257/673 |
| 7,030,501 | B2 | * | 4/2006 | Yoshiba et al. | 257/777 |
| 7,129,572 | B2 | * | 10/2006 | Wang | 257/686 |
| 2002/0074637 | A1 | * | 6/2002 | McFarland | 257/686 |
| 2005/0194674 | A1 | | 9/2005 | Thomas et al. | 257/690 |

FOREIGN PATENT DOCUMENTS

WO 2005/034238 A1 4/2005

OTHER PUBLICATIONS

"Integrated Circuit Packaging Glossary of Terms," ECN Magazine (Nov. 2006).*

* cited by examiner

*Primary Examiner*—Chris C. Chu
(74) *Attorney, Agent, or Firm*—Ryan, Mason & Lewis, LLP (57) ABSTRACT

An integrated circuit comprises a plurality of integrated circuit die arranged in a stack, with a given die other than a top die of the stack carrying current for itself and at least one additional die of the stack via substrate conduction. In one arrangement, each of the die other than a bottom die of the stack carries its power supply current by substrate conduction via a bus or other power supply conductor of an underlying die.

16 Claims, 6 Drawing Sheets

INTEGRATED CIRCUIT WITH STACKED-DIE CONFIGURATION UTILIZING SUBSTRATE CONDUCTION

FIELD OF THE INVENTION

The present invention relates generally to integrated circuits, and more particularly to techniques for providing power supply connections in an integrated circuit via a substrate conduction arrangement.

BACKGROUND OF THE INVENTION

In a typical substrate conduction arrangement, current passes from field effect devices formed on an integrated circuit die to the VSS power supply via the substrate of the integrated circuit die. This advantageously reduces the number of VSS bond pads needed on the front side of the die, and in some cases entirely eliminates the need for such bond pads. Substrate conduction also provides other advantages, including a reduction in power supply lead inductance, as well as alleviation of ringing and ground bounce problems. Single-die substrate conduction arrangements are described in greater detail in U.S. Pat. No. 4,947,228, issued Aug. 7, 1990 in the name of inventor T. J. Gabara and entitled "Integrated Circuit Power Supply Contact," the disclosure of which is incorporated by reference herein.

Figure 1:
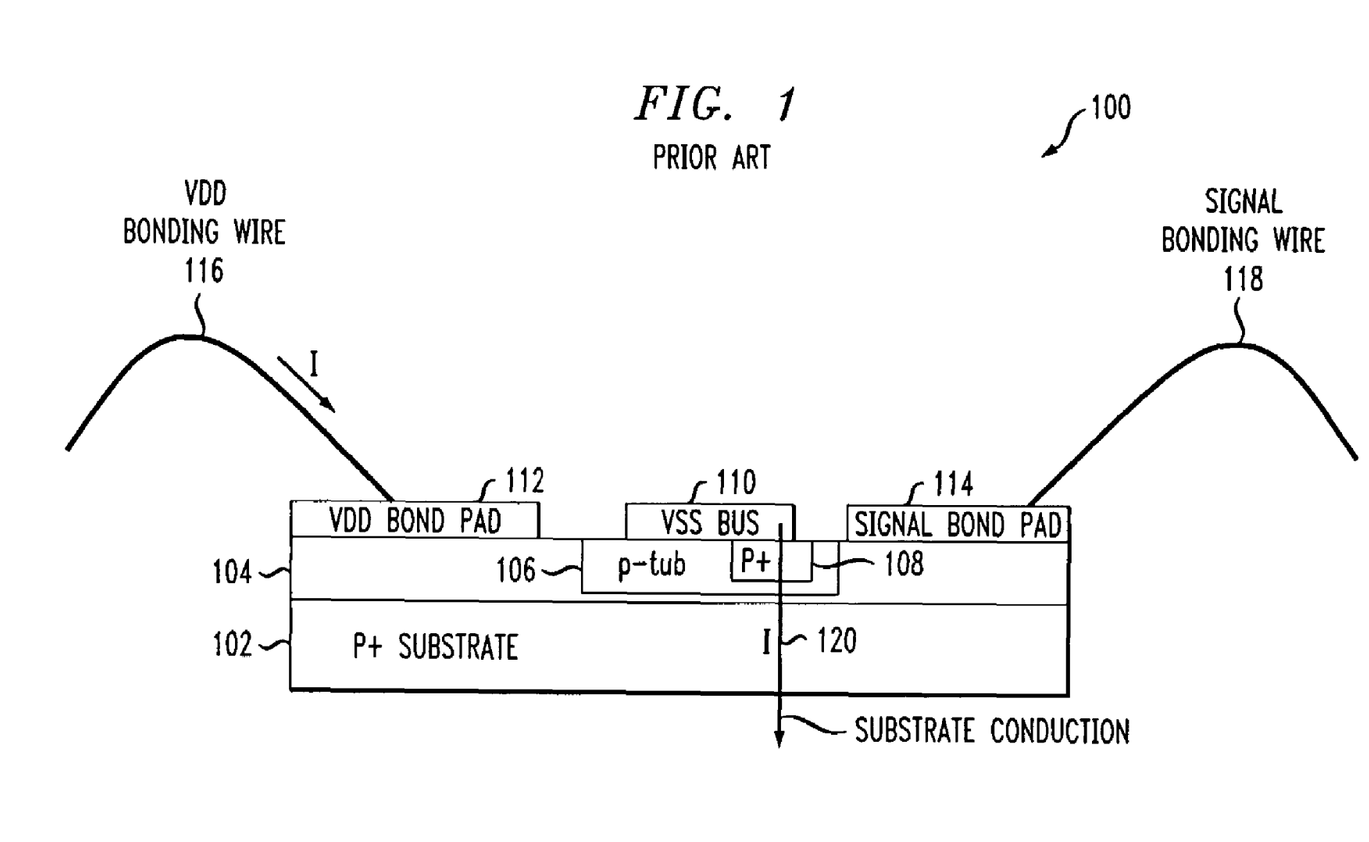
FIG. 1 is a simplified cross-sectional view of a single-die integrated circuit with conventional substrate conduction.

FIG. 1 illustrates an example of conventional single-die substrate conduction of the type described in the above-cited U.S. patent. It should be understood that this drawing, and other drawings herein, are considerably simplified for clarity of description. As shown, an integrated circuit 100 comprises a P+ substrate 102 on which a p-type epitaxial layer 104 is formed. The epitaxial layer is lightly doped relative to the substrate, and thus provides a high resistivity layer. A tub region 106, of p-type conductivity in this example, is formed in the epitaxial layer 104, and a highly-doped P+ tub tie 108 is formed in the tub region 106. The tub tie 108 is connected to a VSS bus 110 of the integrated circuit, which is coupled to terminals of field effect devices not explicitly shown in this simplified drawing. The integrated circuit 100 further includes a VDD bond pad 112 and a signal bond pad 114, which are coupled to a VDD bonding wire 116 and a signal bonding wire 118, respectively. The VDD bonding wire 116, VDD bond pad 112, signal bonding wire 118, signal bond pad 114, and the substrate conduction path formed by the VSS bus 110, P+ tub tie 108 and p-tub 106, can be replicated numerous times on a die.

Although not shown in FIG. 1, a metallic layer may be formed on the back of the substrate 102, that is, on a side of the substrate opposite the epitaxial layer. Such a metallic layer is coupled to a VSS power supply external to the integrated circuit, which is also not shown.

In the FIG. 1 arrangement, a current I passes through the integrated circuit from a VDD supply external to the integrated circuit via VDD bonding wire 116 through VDD bond pad 112 to terminals of field effect devices. Assuming for simplicity of illustration that no current enters or leaves the integrated circuit via signal leads, such as signal bonding wire 118, the current I passes from other terminals of the field effect devices to the VSS bus 110. From the VSS bus, the current I passes through the tub tie 108, p-tub 106 and epitaxial layer 104, and finally through the substrate 102 to an external VSS supply which is not shown in the drawing. The direction of substrate conduction is indicated by the arrow 120. Thus, in this substrate conduction arrangement, the VSS current from the field effect devices flows through the substrate 102, rather than through VSS bonding wires.

A problem with conventional substrate conduction is that the technique was developed in the context of single-die integrated circuits. However, numerous integrated circuits have recently been developed which utilize a stacked-die configuration, in which multiple integrated circuit die are stacked on top of one another with at least a partial overlap between adjacent die. Although the above-noted advantages of single-die substrate conduction would also be desirable in the stacked-die context, it has not heretofore been apparent whether or how substrate conduction could be provided in such a context.

Accordingly, a need exists for techniques for providing substrate conduction in an integrated circuit having a stacked-die configuration.

SUMMARY OF THE INVENTION

The present invention provides substrate conduction techniques suitable for use in stacked-die integrated circuits.

In accordance with one aspect of the invention, an integrated circuit comprises a plurality of integrated circuit die arranged in a stack, with a given die other than a top die of the stack carrying current for itself and at least one additional die of the stack via substrate conduction.

In a first illustrative embodiment, an integrated circuit comprises a first integrated circuit die having a first substrate and a first power supply conductor formed over a portion of the first substrate, and a second integrated circuit die having a second substrate and a second power supply conductor formed over a portion of the second substrate. The second integrated circuit die is stacked on and at least partially overlaps the first integrated circuit die. The first power supply conductor of the first integrated circuit die is conductively coupled to the second substrate of the second integrated circuit die. Power supply current associated with the second integrated circuit die is carried via the first power supply conductor of the first integrated circuit die by substrate conduction through the second substrate. Power supply current associated with the first integrated circuit die is carried by substrate conduction through the first substrate.

The integrated circuit may further comprise at least one additional integrated circuit die having a third substrate and a third power supply conductor formed over a portion of the third substrate, the third integrated circuit die being stacked on and at least partially overlapping the second integrated circuit die. In this case, the second power supply conductor of the second integrated circuit die may be conductively coupled to the third substrate of the third integrated circuit die, and power supply current associated with the third integrated circuit die may be carried via the second power supply conductor of the second integrated circuit die by substrate conduction through the third substrate.

Thus, in this embodiment, the first and second integrated circuit die may be two of N stacked integrated circuit die, where N is greater than two, and wherein each of the die other than a bottom die of the stack carries power supply current, associated with a power supply conductor of an underlying die, by substrate conduction.

In a second illustrative embodiment, an integrated circuit again comprises a first integrated circuit die having a first substrate and a first power supply conductor formed over a portion of the first substrate, and a second integrated circuit die having a second substrate and a second power supply conductor formed over a portion of the second substrate, with the second integrated circuit die being stacked on and at least partially overlapping the first integrated circuit die. However, in this embodiment, power supply current associated with the second integrated circuit die is carried via the first power supply conductor of the first integrated circuit die by substrate conduction through the first and second substrates. This may be achieved by stacking the first and second integrated circuit die in a back-to-back configuration, with the first substrate of the first integrated circuit die facing the second substrate of the second integrated circuit die. The first substrate of the first integrated circuit die may be coupled to the second substrate of the second integrated circuit die via a layer of conductive material, such as silver epoxy. In this embodiment, the power supply current flow in the first integrated circuit may be in a direction from a surface of the first substrate to the first power supply conductor, which is opposite the direction of power supply current flow in the first illustrative embodiment described previously.

The invention in the illustrative embodiments allows the advantages of single-die substrate conduction, such as a reduction in the number of required power supply bond pads, to be obtained in integrated circuits having stacked-die configurations.

DETAILED DESCRIPTION OF THE INVENTION

The present invention will be illustrated herein in the context of a number of exemplary stacked-die integrated circuits, and substrate conduction arrangements implemented in such circuits. It should be understood, however, that the particular arrangements shown are provided by way of illustrative example only, and not intended to limit the scope of the invention in any way. As will become apparent, the techniques of the invention are utilizable in a wide variety of other stacked-die integrated circuit configurations in which it is desirable to reduce the required number of VSS bond pads, or to obtain other advantages typically associated with substrate conduction in single-die integrated circuits.

Figure 2:
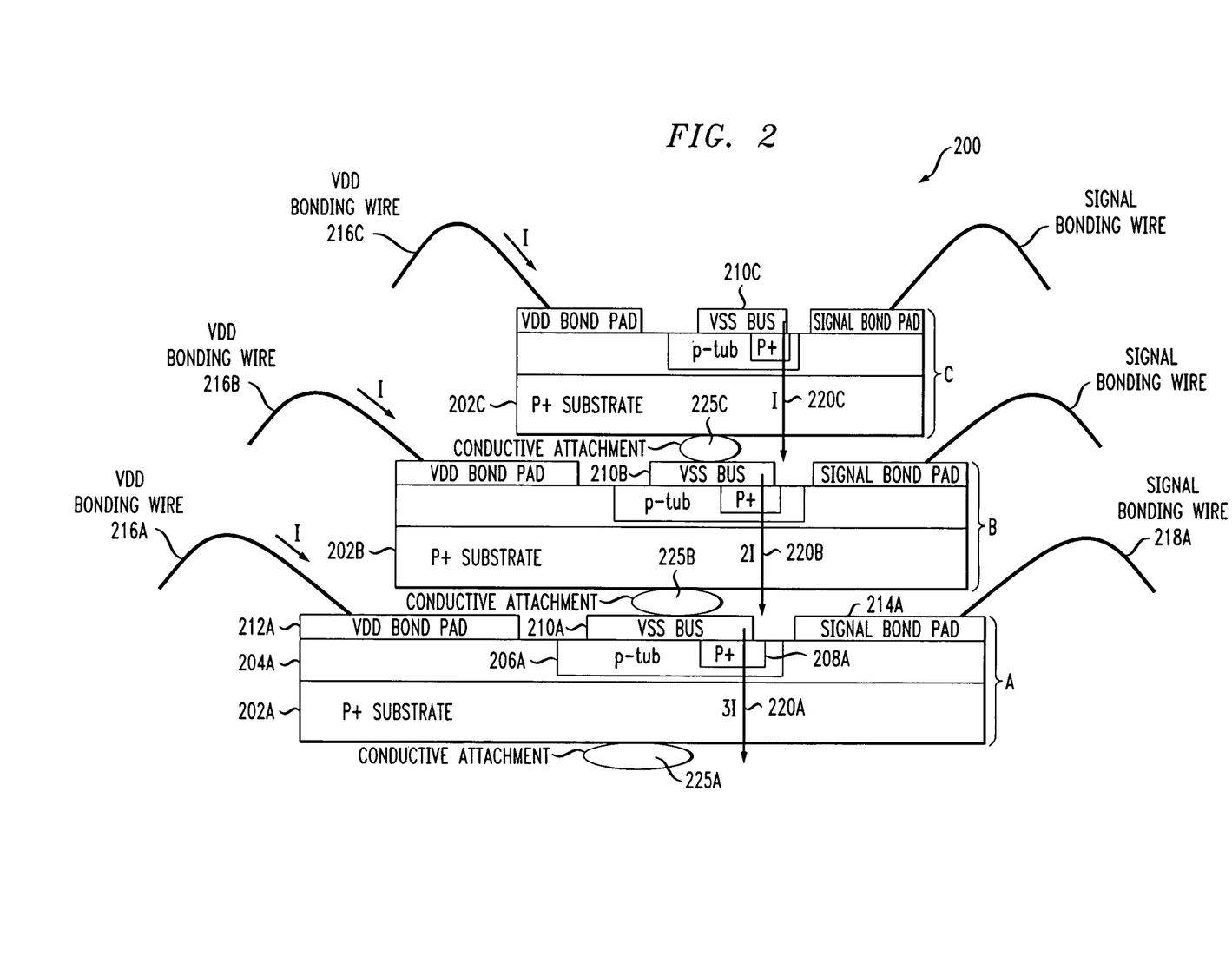
FIG. 2 is a simplified cross-sectional view of a stacked-die integrated circuit with substrate conduction in accordance with a first illustrative embodiment of the invention.

FIG. 2 shows a stacked-die integrated circuit 200 with substrate conduction in accordance with a first illustrative embodiment of the invention. Generally, in this embodiment, the integrated circuit 200 comprises a plurality of integrated circuit die arranged in a stack, with each of the die other than a bottom die of the stack carrying its power supply current by substrate conduction via a power supply conductor of an underlying die. More particularly, the stacked-die integrated circuit 200 includes three individual die, denoted A, B and C, arranged in a stack in which die A is a first or bottom die of the stack, die B is a second die of the stack and at least partially overlaps die A, and die C is a third or top die of the stack and at least partially overlaps die B. Each of the die other than the bottom die A carries its power supply current by substrate conduction via a power supply conductor of an underlying die of the stack. That is, die C carries its VSS power supply current by substrate conduction via a VSS power supply conductor of die B, and die B carries its VSS power supply current by substrate conduction via a VSS power supply conductor of die A.

The bottom die, die A, also carries its power supply current via substrate conduction, but via connection with a VSS power supply, which is not shown, rather than via a VSS power supply conductor of an underlying die.

As is well known, the VSS power supply for a given integrated circuit may comprise a circuit ground or other ground potential. The terms "VSS power supply" or "power supply" as used herein are intended to include ground, in addition to positive or negative voltage potentials.

The term "stack" as used herein should be understood to include, without limitation, any arrangement in which a plurality of integrated circuit die are configured in an at least partially overlapping manner relative to one another. Thus, the die need not decrease in size from the bottom to the top of the stack as illustratively shown in FIG. 2. Instead, the die could increase in size, or could be substantially uniform in size, from the bottom to the top of a given stack. Also, a given die need not fully overlap with an underlying or overlying die, and thus a wide variety of partially overlapping arrangements are contemplated.

A given substrate in the illustrative embodiments described herein may be viewed as comprising part of a conductive path formed between a front side and a back side of an integrated circuit die. This conductive path ideally should be designed with a maximum conductance (minimum resistance) so that the voltage drop in the conductive path is reduced, although the invention does not require such an arrangement.

For example, in FIG. 2, the substrate conduction current flow 220A is conducted by a conductive path in die A formed by a number of elements including various layers of p-type dopant material and the VSS bus 210A, as described earlier. Some of the layers of the p-type dopant material, such as the p-tub 206A and epitaxial layer 204A may be formed with a lightly-doped p-type concentration. These two layers (204A and 206A) will typically have a lower conductance (higher resistance) then the remaining p-type layers (202A and 208A), which may cause a undesirable voltage drop to occur in the conductive path.

The voltage drop of the conductive path can be reduced by, for example, selectively increasing the p-type dopant concentration within layers 204A and 206A using processing techniques known in the art. As another example, the dopant implantation forming the P+ tub tie 208A can be driven further into the die such that the P+ tub tie 208A is in physical contact with the P+ substrate 202A, thereby allowing the conductive path to have a maximum conductance (minimum resistance). Yet another example is to place a P+ buried layer (not shown) under the P+ tub tie 208A. During the normal processing steps, the p-type dopant within the buried layer will be diffused (driven out), connecting the P+ tub tie 208A to the P+ substrate 202A and increasing the conductance of the conductive path.

The bottom die A in the stacked-die integrated circuit 200 of FIG. 2 comprises a P+ substrate 202A, a lightly-doped p-type epitaxial layer 204A, a p-tub 206A, a P+ tub tie 208A, a VSS bus 210A, a VDD bond pad 212A, a signal bond pad 214A, a VDD bonding wire 216A, and a signal bonding wire 218A. These elements are configured in a manner similar to the corresponding elements of the conventional single-die integrated circuit 100 of FIG. 1. A conductive attachment 225A provides a connection between the substrate 202A and the above-noted external VSS power supply. Although not shown in the figure, a metallic layer may be formed on the back of the substrate 202A, that is, on a side of the substrate opposite the epitaxial layer 204A. Such a metallic layer may be coupled to the external VSS power supply. It should be noted that conductive attachment 225A may comprise such a metallic layer, or any other type of conductive element suitable for coupling the substrate 202A to the VSS power supply.

In addition, each of the die B and C includes elements similar to those of die A. For example, die B and C comprise respective substrates 202B and 202C, and respective VSS buses 210B and 210C. The VSS buses 210A, 210B and 210C may be viewed as illustrative examples of what are more generally referred to herein as "power supply conductors." This term is intended to include, without limitation, any type of conductive element that may be used to provide supply voltage to one or more field effect devices or other elements of an integrated circuit die, where such other elements may include, without limitation, bipolar transistors, resistive components, or other active or passive components. For example, a power supply conductor may be a metallic interconnect formed on a front surface of a particular die and connected to the substrate of the die. Such a metallic interconnect is typically formed by using one or more of the metal layers available in a given technology for the particular die.

The first or bottom integrated circuit die A thus comprises substrate 202A and a power supply conductor 210A formed over a portion of the substrate 202A. The second integrated circuit die B has a substrate 202B and a power supply conductor 210B formed over a portion of the substrate 202B. The power supply conductor 210A of die A is conductively coupled to the substrate 202B of die B, using conductive attachment 225B, such that VSS power supply current for die B is carried via the VSS power supply conductor 210A of die A by substrate conduction through the substrate 202B. The third or top integrated circuit die C comprises substrate 202C and a power supply conductor 210C formed over a portion of the substrate 202C. The power supply conductor 210B of die B is conductively coupled to the substrate 202C of die C, using conductive attachment 225C, such that VSS power supply current for die C is carried via the power supply conductor 210B of die B by substrate conduction through the substrate 202C.

In this illustrative embodiment, it is assumed that each of the die A, B and C draws a supply current given by I. This current passes from an external VDD supply, not shown in the figure, to the die A, B and C, via respective VDD bonding wires 216A, 216B and 216C in a direction indicated by the corresponding arrows. Assuming again for simplicity of illustration that no current enters or leaves the integrated circuit via signal leads, an amount of current I will flow between each of the die A, B and C and the VSS supply. The total amount of current carried by substrate conduction through substrate 202A is thus given by 3I, as indicated by arrow 220A. Similarly, as indicated by arrows 220B and 220C, the amount of current carried by substrate conduction through substrates 202B and 202C is given by 2I and I, respectively. Thus, the bottom die A carries current for all three of the die A, B and C via substrate conduction. More generally, a given die other than the top die in the stacked-die integrated circuit carries current for itself and at least one additional die via substrate conduction. It should be noted that in an alternative embodiment utilizing an N+ substrate instead of a P+ substrate, the substrate current flow will be in a direction opposite that shown by the current arrows in FIG. 2.

Although shown in an unpackaged arrangement in FIG. 2, the stacked-die integrated circuit 200 may be packaged using techniques known in the art. For example, the circuit 200 may be packaged using a flip-chip BGA package, of a type to be described in conjunction with FIG. 4, or any other packaging arrangement suitable for use with a stacked-die integrated circuit.

Also, the FIG. 2 embodiment utilizes a p-type conductivity arrangement, in which elements such as substrate 202A, epitaxial layer 204A, p-tub 206A, and tub tie 208A are comprised of p-type semiconductor material. It should be appreciated that other type of conductivity arrangements may be used. Examples of such alternative conductivity arrangements will be shown and described in conjunction with FIGS. 5 and 6.

Figure 3:
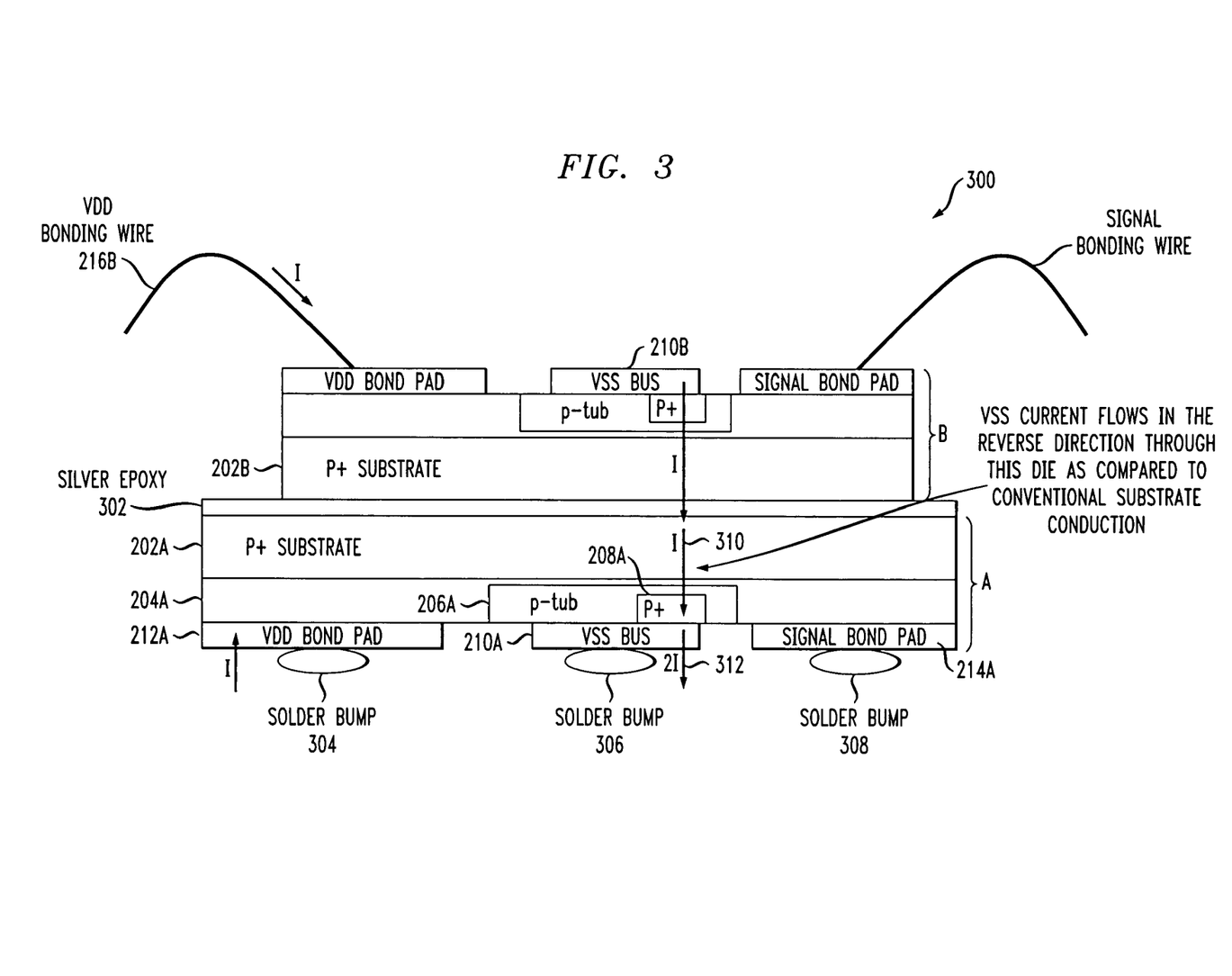
FIG. 3 is a simplified cross-sectional view of a stacked-die integrated circuit with substrate conduction in accordance with a second illustrative embodiment of the invention.

FIG. 3 shows a stacked-die integrated circuit 300 with substrate conduction in accordance with a second illustrative embodiment of the invention. This embodiment includes integrated circuit die A and B, each including substantially the same set of elements as in the previously-described embodiment. However, in this embodiment, the second integrated circuit die B is stacked on and at least partially overlapping the first integrated circuit die A, in a back-to-back configuration, with the substrate 202A of die A facing the substrate 202B of die B. The VSS power supply current for die B in this embodiment is carried via power supply conductor 210A of die A, by substrate conduction through the substrates 202A and 202B in the direction indicated by the vertical arrows between power supply conductors 210B and 210A. Thus, the current flow of the VSS power supply current through die A is in a direction from a surface of the substrate 202A to the power supply conductor 210A. It should be noted that this direction is opposite to the direction of current flow in the substrate conduction arrangements of FIGS. 1 and 2. Accordingly, this type of substrate conduction may be referred to herein as "reverse" substrate conduction.

The substrates 202A and 202B are separated from one another in this embodiment by a layer 302 of conductive material, such as silver epoxy. Other conductive material layers or conductive coupling arrangements may be used between the facing substrates. Solder bumps 304, 306 and 308 associated with VDD bond pad 212A, VSS power supply conductor 210A and signal bond pad 214A, respectively, are utilized in packaging the stacked-die integrated circuit 300 using, for example, an otherwise conventional BGA package.

In this illustrative embodiment, it is assumed that each of the die A and B draws a supply current given by I. This current passes from an external VDD supply, not shown in the figure, to the die A and B, via VDD bond pad 212A and VDD bonding wire 216B, in a direction indicated by the corresponding arrows. Assuming once again for simplicity of illustration that no current enters or leaves the integrated circuit via signal leads, an amount of current I will flow between each of the die A and B and the VSS supply. The total amount of current carried by substrate conduction through substrate 202A is given by I, as indicated by arrow 310. More specifically, the bottom die A conducts a first current I from die B via reverse substrate conduction. A second current I entering the VDD bond pad 212A is applied to the devices or elements formed on the surface of the die A. These devices or elements return the second current I to the VSS power supply. The current 2I shown by arrow 312 is the summation of the first current I and the second current I.

The back-to-back substrate arrangement of FIG. 3 may be used with one or more additional integrated circuit die, for example, in combination with additional die configured in an arrangement of the type shown in FIG. 2. A given stacked-die integrated circuit in accordance with the invention may therefore use a combination of the techniques illustrated in FIGS. 2 and 3.

Figure 4:
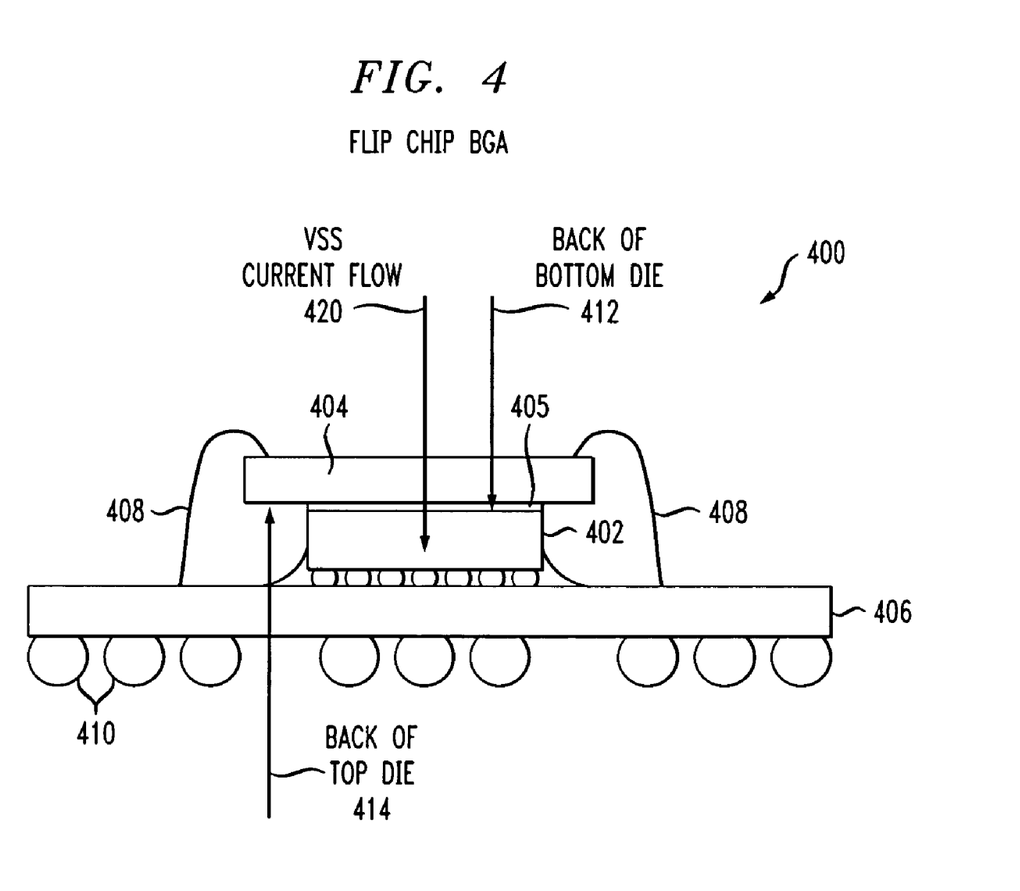
FIG. 4 shows an example of one particular implementation of a stacked-die integrated circuit of the type shown in FIG. 3, using a flip-chip ball grid array (BGA) package.

FIG. 4 shows a particular implementation of a stacked-die integrated circuit of the type shown in FIG. 3, using a flip-chip BGA package. In this embodiment, a stacked-die integrated circuit 400 includes a first or bottom integrated circuit die 402 and a second or top integrated circuit die 404 arranged in a stack as shown. The backs of the bottom and top die 402 and 404 are denoted by respective arrows 412 and 414. As is apparent, the bottom and top die 402 and 404 are arranged in a back-to-back configuration of the type previously described in conjunction with FIG. 3. A layer 405 of silver epoxy or other conductive material couples the substrates of the bottom and top die 402 and 404. The bottom die 402 is attached to a mounting structure 406 of the flip-chip BGA package, and bond wires 408 are connected to an upper surface of the top die 404. Conductive traces in the mounting structure 406 connect conductors on the front side of bottom die 402 with solder balls 410 of the flip-chip BGA package. The direction of VSS current flow in this embodiment is in the direction indicated by arrow 420, as in the FIG. 3 embodiment.

Figure 5:
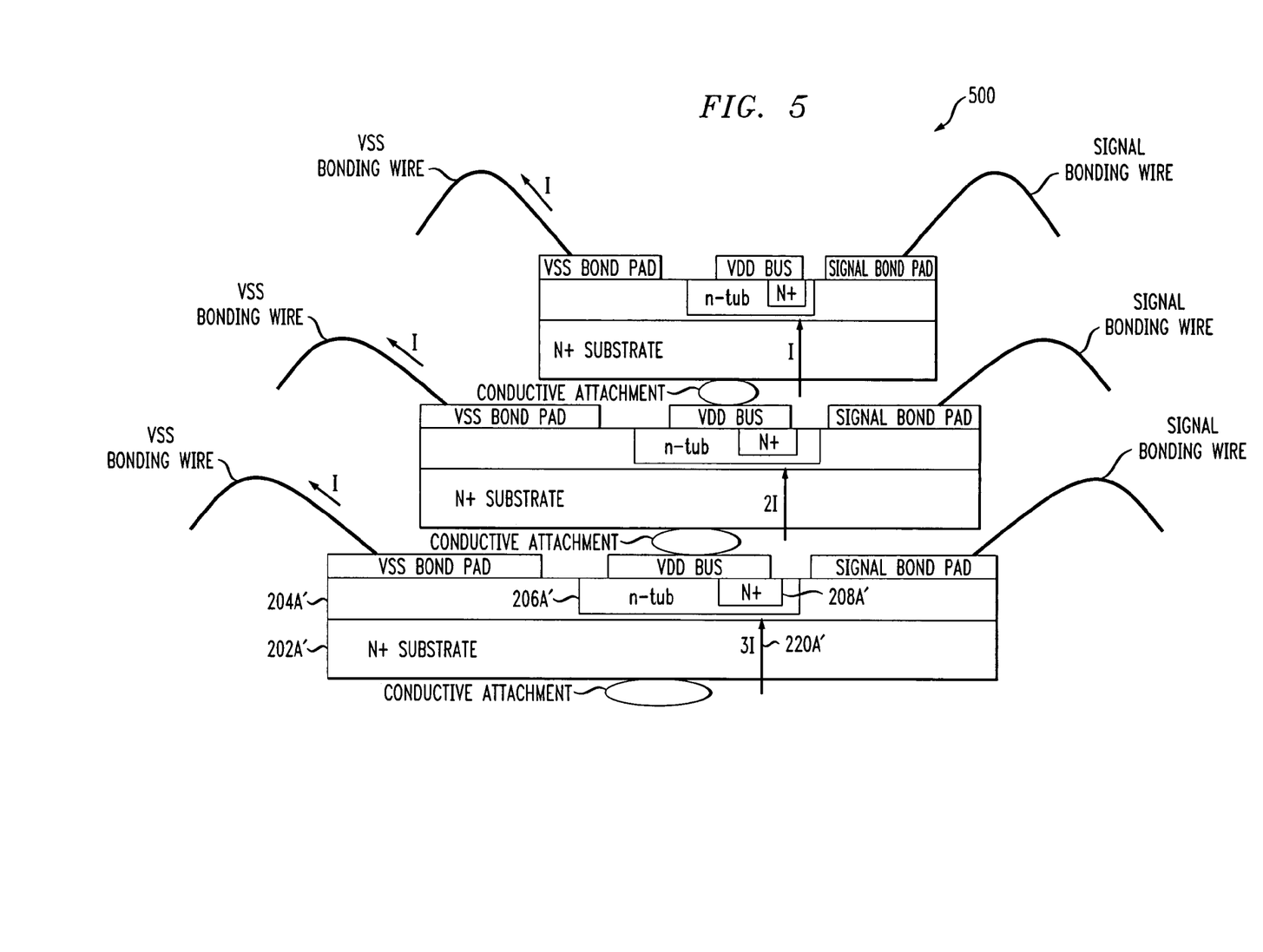
FIGS. 5 and 6 show embodiments of the invention corresponding generally to those of FIGS. 2 and 3, respectively, but implemented using elements of opposite conductivity type.
Figure 6:
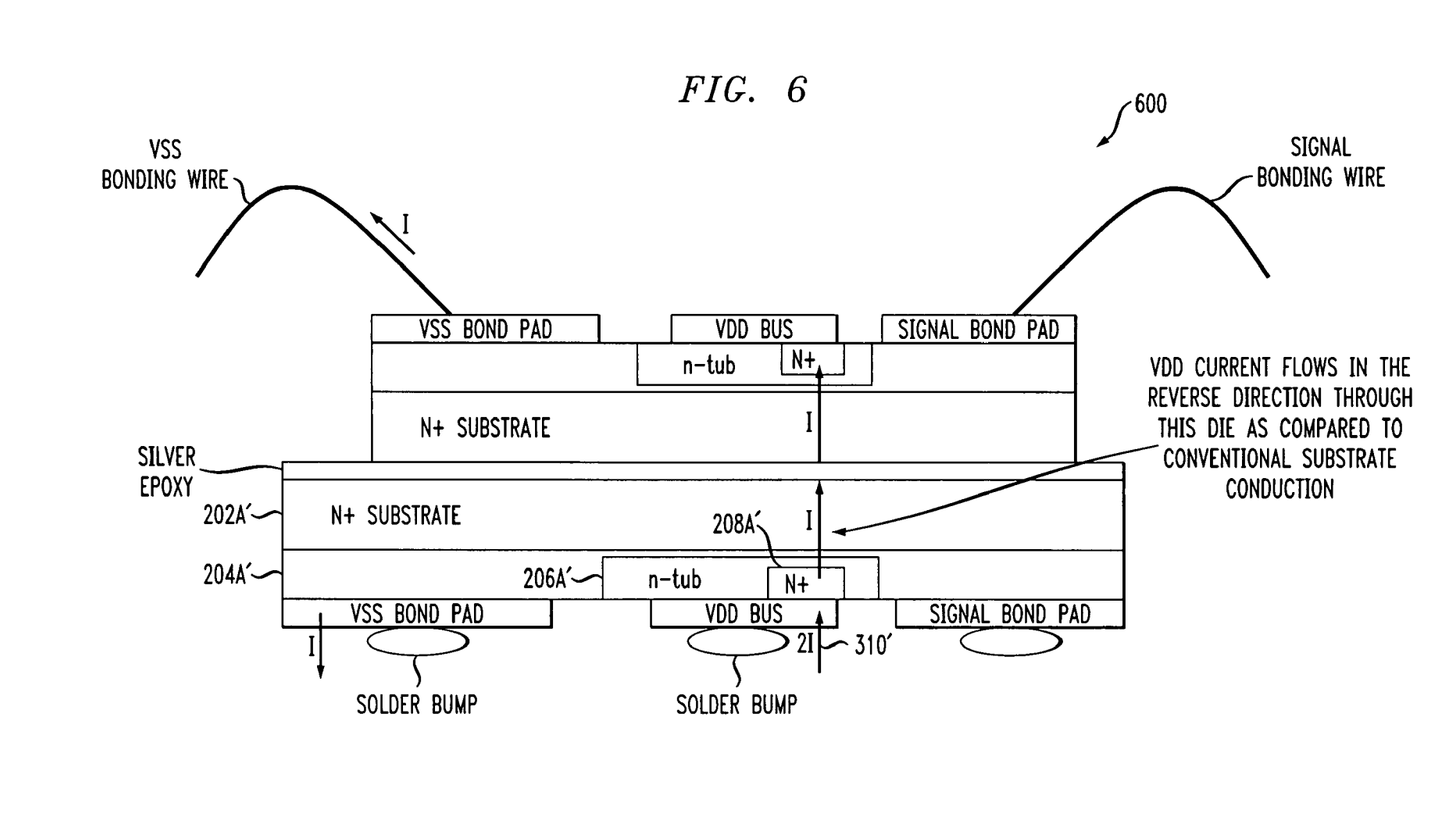

FIGS. 5 and 6 show embodiments of the invention corresponding generally to those of FIGS. 2 and 3, respectively, but implemented using substrate, epitaxial layer, tub and tub tie elements of opposite conductivity type. More specifically, elements such as substrate 202A', epitaxial layer 204A', tub 206A' and tub tie 208A', which correspond to elements comprised of p-type semiconductor material in the embodiments of FIGS. 2 and 3, are comprised of n-type semiconductor material in the stacked-die integrated circuits 500 and 600 of FIGS. 5 and 6, respectively. Also, connections to VDD and VSS supplies are reversed, with the bond pads in FIGS. 5 and 6 corresponding to VSS bond pads and the power supply conductors in FIGS. 5 and 6 corresponding to VDD buses. As a result, the direction of current flow indicated by, for example, arrow 220A' in FIG. 5 and arrow 310' in FIG. 6, is reversed relative to the corresponding directions as indicated in FIGS. 2 and 3. Otherwise, the configuration and operation of these alternative embodiments is substantially the same as that of the embodiments previously described. Again, other arrangements of different conductivity types may be used, and the invention is not limited in this regard.

It should be noted that the particular stacked-die configurations shown in FIG. 2 through 6 are presented by way of illustrative example only, and should not be construed as limiting the scope of the invention in any way. Also, certain conventional elements have been omitted from the figures for clarity and simplicity of illustration. Such omitted elements may be included in a given embodiment of the invention, as will be appreciated by those skilled in the art.

As indicated above, a given embodiment of the present invention can be implemented as one or more integrated circuits. In such an arrangement, a plurality of identical die are typically formed in a repeated pattern on a surface of a wafer. Each die may include a device as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

The above-described embodiments of the invention are intended to be illustrative only. Numerous alternative embodiments may be devised by those skilled in the art without departing from the scope of the following claims. For example, numerous alternative configurations of integrated circuit elements such as substrates or other semiconductor layers or regions, bond pads, bond wires, stack arrangements, conductive attachments or package types can be used. These and other alternative embodiments will be readily apparent to those skilled in the art.

What is claimed is:

1. An integrated circuit comprising:
a first integrated circuit die having a first substrate and a first power supply conductor formed over a portion of the first substrate; and
a second integrated circuit die having a second substrate and a second power supply conductor formed over a portion of the second substrate;
the second integrated circuit die being stacked on and at least partially overlapping the first integrated circuit die;
the first power supply conductor of the first integrated circuit die being conductively coupled to the second substrate of the second integrated circuit die;
wherein power supply current associated with the second integrated circuit die is carried via the first power supply conductor of the first integrated circuit die by substrate conduction through the first substrate and the second substrate;
wherein the first and second integrated circuit die are stacked in a back-to-back configuration with back side surfaces of the respective first and second substrates facing one another.

2. The integrated circuit of claim 1 wherein power supply current associated with the first integrated circuit die is carried by substrate conduction through the first substrate.

3. The integrated circuit of claim 1 further comprising at least one additional integrated circuit die having a third substrate and a third power supply conductor formed over a portion of the third substrate, the third integrated circuit die being stacked on and at least partially overlapping the second integrated circuit die.

4. The integrated circuit of claim 3 wherein the second power supply conductor of the second integrated circuit die is conductively coupled to the third substrate of the third integrated circuit die.

5. The integrated circuit of claim 4 wherein power supply current associated with the third integrated circuit die is carried via the second power supply conductor of the second integrated circuit die by substrate conduction through the third substrate.

6. The integrated circuit of claim 1 wherein the first and second integrated circuit dies are two of N stacked integrated circuit dies, where N is greater than two, and wherein each of the dies other than a bottom die of the stack carries power supply current by substrate conduction via a power supply conductor of an underlying die.

7. The integrated circuit of claim 1 wherein the first power supply conductor of the first integrated circuit die is conductively coupled to the second substrate of the second integrated circuit die via a conductive attachment arranged between the first power supply conductor and the second substrate.

8. The integrated circuit of claim 1 wherein at least one of the first and second power supply conductors comprises one of a VSS bus and a VDD bus of the corresponding first or second integrated circuit die.

9. The integrated circuit of claim 1 wherein the power supply current for the second integrated circuit, carried via the first power supply conductor of the first integrated circuit die by substrate conduction through the second substrate, comprises one of a VSS supply current and a VDD supply current.

10. The integrated circuit of claim 1 wherein a conductive attachment couples the substrate of a given one of the integrated circuit dies to a power supply conductor.

11. The integrated circuit of claim 10 wherein the conductive attachment comprises a metallic layer formed on the back side surface of the substrate of the given one of the integrated circuit dies.

12. The integrated circuit of claim 1 wherein the integrated circuit is packaged to form a packaged integrated circuit.

13. The integrated circuit of claim 12 wherein the integrated circuit is packaged in a flip-chip ball grid array package.

14. An integrated circuit comprising:
a plurality of integrated circuit die arranged in a stack;
wherein each of the die other than a bottom die of the stack carries its power supply current by substrate conduction through its own substrate via a power supply conductor and substrate of an underlying die; and
wherein first and second integrated circuit die of the plurality of integrated circuit die are stacked in a back-to-back configuration with back side surfaces of respective first and second substrates of said first and second die facing one another.

15. An integrated circuit comprising:
a plurality of integrated circuit die arranged in a stack;
wherein a given die other than a top die of the stack carries current for itself and at least one additional die via substrate conduction; and
wherein first and second integrated circuit die of the plurality of integrated circuit die are stacked in a back-to-back configuration with back side surfaces of respective first and second substrates of said first and second die facing one another.

16. An integrated circuit comprising:
a first integrated circuit die having a first substrate and a first power supply conductor formed over a portion of the first substrate; and
a second integrated circuit die having a second substrate and a second power supply conductor formed over a portion of the second substrate;
the second integrated circuit die being stacked on and at least partially overlapping the first integrated circuit die;
wherein power supply current for the second integrated circuit die is carried via the first power supply conductor of the first integrated circuit die by substrate conduction through the first and second substrates; and
wherein the first and second integrated circuit die are stacked in a back-to-back configuration with back side surfaces of the respective first and second substrates facing one another.

* * * * *